United States Patent
Pleva

(10) Patent No.: US 7,073,340 B2
(45) Date of Patent: Jul. 11, 2006

(54) CRYOGENIC COMPRESSOR ENCLOSURE DEVICE AND METHOD

(75) Inventor: Edward F. Pleva, Waukesha, WI (US)

(73) Assignee: Waukesha Electric Systems, Waukesha, WI (US)

( * ) Notice: Subject to any disclaimer, the term of this patent is extended or adjusted under 35 U.S.C. 154(b) by 4 days.

(21) Appl. No.: 10/687,619

(22) Filed: Oct. 20, 2003

(65) Prior Publication Data

US 2005/0081538 A1 Apr. 21, 2005

(51) Int. Cl.
*F17C 13/00* (2006.01)

(52) U.S. Cl. ............................... 62/50.6; 62/51.1
(58) Field of Classification Search ............. 62/50.6, 62/51.1, 91, 92, 93; 138/149, 115, 116, 117
See application file for complete search history.

(56) References Cited

U.S. PATENT DOCUMENTS

| | | | | |
|---|---|---|---|---|
| 3,600,903 A | * | 8/1971 | Chellis et al. | 62/6 |
| 3,718,974 A | * | 3/1973 | Buchtel et al. | 433/27 |
| 3,799,249 A | * | 3/1974 | Linhardt | 165/60 |
| 4,356,707 A | * | 11/1982 | Tyree et al. | 62/381 |
| 4,378,626 A | * | 4/1983 | Eitel | 29/527.2 |
| 4,490,993 A | * | 1/1985 | Larriva | 62/304 |
| 5,333,460 A | * | 8/1994 | Lewis et al. | 62/6 |
| 5,628,197 A | * | 5/1997 | Rada | 62/62 |
| 5,661,980 A | * | 9/1997 | Gallivan | 62/51.1 |
| 5,703,536 A | * | 12/1997 | Davis et al. | 330/289 |
| 5,706,668 A | | 1/1998 | Hilpert | 62/259.2 |
| 5,782,095 A | * | 7/1998 | Chen | 62/47.1 |
| 6,050,331 A | * | 4/2000 | Breault et al. | 165/168 |
| 6,212,904 B1 | * | 4/2001 | Arkharov et al. | 62/615 |
| 6,345,512 B1 | | 2/2002 | Cosley et al. | 62/259.2 |
| 6,684,661 B1 | * | 2/2004 | Beasley et al. | 62/474 |

FOREIGN PATENT DOCUMENTS

| | | |
|---|---|---|
| EP | 0 590 546 | 4/1994 |
| EP | 0 840 076 | 5/1998 |
| EP | 0 844 446 | 5/1998 |
| FR | 2330140 A * | 7/1977 |
| JP | 407161522 A * | 6/1995 |

OTHER PUBLICATIONS

K. Ohira, et al., "Study On the Reduction of Current For A High Field Superconducting Magnet By Using A Superconducting Transformer", Cryogenics 1996, vol. 36, No. 3, pp. 167-170.

* cited by examiner

Primary Examiner—Mohammad M. Ali
(74) Attorney, Agent, or Firm—Baker & Hostetler LLP

(57) ABSTRACT

A low-leakage enclosure for cryogenic compressor apparatus includes climate control equipment and guide fixtures to direct ultra-cold coolant lines to a superconducting utility power transformer. The self-contained system maintains the required number of high performance chillers within a narrow temperature range to ensure reliable operation in an unprotected outdoor environment. The enclosure advances the technology of superconducting power systems closer to final deployable status.

18 Claims, 3 Drawing Sheets

CRYOGENIC COMPRESSOR ENCLOSURE DEVICE AND METHOD

FIELD OF THE INVENTION

The present invention relates generally to enclosures for cryogenic apparatus. More particularly, the invention relates to insulating housings providing containment for compressors and tubing that support the functions of superconducting transformers.

BACKGROUND OF THE INVENTION

Cryogenic coolers (cryocoolers) are used to lower the temperature of the conductive components of superconducting devices to the temperature range where superconductivity occurs, at which temperature resistance drops to near zero, and conductors of relatively small cross sectional area can conduct very large amounts of current. In a conventional utility transformer for multiple-kilowatt industrial or residential power distribution, for example, fifteen tons or more of copper may be needed to allow the needed current to flow, and temperature equalization may be achieved by immersing the transformer in more tons of highly refined petroleum distillate (mineral) oil with properties resembling those of automobile motor oil, in some cases cooled with external radiators equipped with electric fans to couple the heat to the atmosphere. A superconducting transformer for the same utility load, by contrast, may have conductors weighing a ton or less, may occupy a fraction of the physical space, and may use no mineral oil.

Known superconductor materials may be categorized by their properties. Some are only marginally superconducting, and have such properties that large current flows cause their superconductivity to be lost. Others are superconducting only within a fraction of a degree of absolute zero (zero kelvins, or −273.15 degrees Celsius), requiring significant effort to maintain the working temperature against external environmental temperatures. Still others are highly frangible, so that they tend to crack under quite mild stresses, which can introduce resistive boundaries between superconducting segments and can cause destructive hot spots when such superconductors are used for high currents and variable loads. At this time, a superconductor that can carry industrial amperage at a temperature of 20 kelvins is viewed as a high-temperature superconductor. High-temperature superconductors that carry still higher currents at still higher temperatures may achieve commercial success in the future.

A representative electrical superconducting device may function economically when surrounded by an insulated container through which cooling media and wires for electrical power transmission may pass but through which heat travels with comparatively low efficiency. A container employing a thermal boundary region that is at least in part evacuated may be commonly referred to, and is herein, as a Dewar.

The output of a cryocooler using liquid nitrogen is capable of providing a heat sink that can be adapted to provide an effective thermal barrier between a Dewar's outer envelope and an inner, gaseous helium-based system, which can in turn maintain the temperatures needed for superconducting utility transformers. For such a system, the liquid nitrogen cryocooler can include a high-temperature, pressurized, gaseous segment, operating at a temperature high enough to couple its waste heat to another heat exchanger with useful efficiency; a low-temperature, high-pressure liquid segment, transporting phase changed nitrogen back to the heat sink; a low-temperature, low-pressure gaseous segment, in which heat of vaporization for the nitrogen is accepted from the Dewar, and a compressor segment in which the heat-bearing gaseous nitrogen is raised in temperature by pressurization.

A cryocooler working with helium as a thermal exchange medium may evolve its waste heat within a rather broad general range of room temperature, such as at temperatures in the vicinity of 200–400 K. Such a cryocooler can, for example, successfully and safely discharge its waste heat into a surrounding volume of air. Operating such a device in a full, worldwide outdoor climate can demand significant performance from scroll compressors and other cryocooler technology elements.

A helium cryocooler may employ substantially the same thermal cycle as the nitrogen cryocooler described above, with the exception that typical helium cryocoolers of current technology do not employ phase changes in the cycle, a simplification that allows the process to operate at a higher and thus less technically challenging range of temperatures. Heat coupling between a superconducting transformer and the helium of a cryocooler may take place in a further insulated chamber inside the Dewar, in which gaseous helium floods the transformer to capture the waste heat from the superconductor power management process. Heat coupling may also take place with the helium cryocooler functioning as a heat sink for the nitrogen cryocooler's heat exchanger as described above.

Accordingly, there is a need in the art for a rugged, long-life helium compressor/heat exchanger system to be housed adequately for all-weather operation, which compressor/heat exchanger can directly service large-scale, high-power superconductors, can mate with a nitrogen system and can provide effective discharge of waste heat to an uncontrolled environment.

SUMMARY OF THE INVENTION

The foregoing needs are met, to a great extent, by the present invention, wherein in one aspect an apparatus is provided that in some embodiments supports operation of a superconducting transformer with a multiple-unit helium-based cooling apparatus in a climate-controlled housing. The housing further provides guidance, insulation, and protection to the coolant lines passing from the helium cooling apparatus to nitrogen heat exchanger feed ports.

In accordance with one aspect of the present invention, an enclosure for containing at least one coolant compressor for a housed superconducting transformer comprises a cabinet coupled to the insulating Dewar of the superconducting transformer; an air conditioner affixed to the cabinet; a rack assembly supporting at least one compressor, and a plurality of coolant line guides positioned within the cabinet.

In accordance with another aspect of the present invention, an enclosure for containing at least one coolant compressor in support of a housed cryogenic apparatus comprises means for mechanically supporting a coolant compressor adjacent to a side surface of the housed apparatus; means for enclosing a thermally insulated volume surrounding the supporting means; means for removing heat from the enclosing means; and means for controlling moisture concentration within the enclosing means.

In accordance with yet another aspect of the present invention, a method for providing a controlled environment for at leat one coolant compressor in support of a housed cryogenic apparatus comprises the steps of supporting a coolant compressor adjacent to a side surface of the housed cryogenic apparatus; enclosing a thermally insulated volume including the coolant compressor; removing heat from the enclosing volume; controlling moisture concentration within the enclosed volume; and enclosing and guiding coolant lines within an insulated volume leading at least partway toward a cryohead.

There have thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

DETAILED DESCRIPTION

Figure 1:
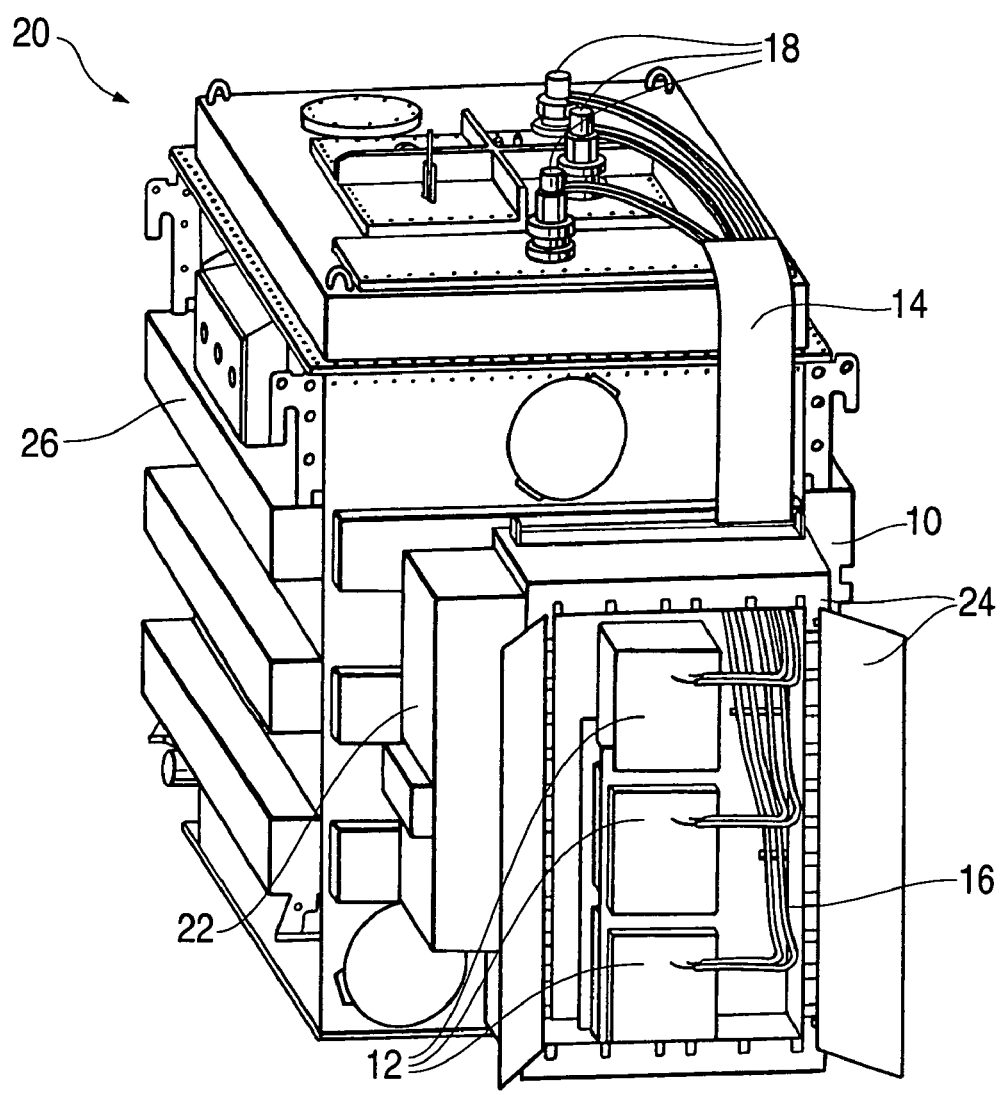
FIG. 1 is a perspective view illustrating a superconductive transformer system with a gaseous helium cooling apparatus housed in accordance with the present invention.

The invention will now be described with reference to the drawing figures, in which like reference numerals refer to like parts throughout. The present invention provides an apparatus and method that in some embodiments is capable of achieving uniform climate control to the coolers of and protection to the coolant lines external to a superconducting transformer to assure unrestricted flow of cryogenic fluid through the coolant lines.

Contemporary design concepts for superconducting transformers for utility power distribution anticipate using for their windings conductive ribbons on which superconductive films are deposited, which method both provides structural strength and provides an alternative current path, albeit at reduced performance, for service during such activities as testing, power application, and casualty shutdown. The superconducting ribbons exhibit negligible resistance to electrical current in the regions in which conductivity is intact, although present technology limits the effective length of superconducting segments, leaving non-superconducting boundaries at which, in operation, heat is dissipated. The superconducting transformer windings surround cores comparable to conventional transformer cores, in which likewise electrical energy is dissipated as heat during operation. Some present system implementations partition the heat generators into three regions, substantially insulated from each other, and individually cooled by gaseous helium in three innermost heat exchanger systems.

The heat exchangers in the exemplary system described herein include both helium-based and nitrogen-based types, each performing a part of the cooling process for the superconducting transformers. The helium-based heat exchangers both directly cool the windings of the superconducting transformer and draw away heat passing through the walls of the Dewar, which heat is first absorbed by the nitrogen-based heat exchanger, then coupled into the helium, which is removed from the Dewar and subsequently expels its heat into the atmosphere.

The nitrogen-based heat exchangers are sufficiently compact to operate housed entirely within the envelope of the Dewar, releasing their waste heat by way of fluid coupling to one of the helium-based heat exchangers. The helium-based heat exchangers themselves may require substantial working volume; similar units of apparatus in previous prototype systems have been placed outside the Dewar. The helium-to-air heat exchangers in the exemplary system described herein are located in part within the large Dewar comprising the housing for the transformer, in part above the Dewar's top surface, and in part outside. This physical layout introduces mechanical challenges in the transition to demonstration and production service for superconducting transformers.

Within the assembly, a coolant line pathway extends from the coolant compressors to at least one cryocooler cryohead mounted to a cover assembly of a transformer tank enclosing the superconducting transformer internal assembly, where the term cryohead is understood in the art to mean an interface device coupling cryogenic coolant lines to cryogenic housings, typically although not necessarily atop a housing, and the term transformer tank refers to a housing enclosing a transformer, where such a tank may permit sealing, evacuating, or otherwise controlling the environment in which the transformer operates.

An embodiment of the present enclosure is illustrated in FIG. 1. In FIG. 1, a housing 10 encloses a multiplicity of chilling units 12 and provides a guide 14 for coolant lines 16 leading from the chilling units 12 to their corresponding cryoheads 18 as an accessory apparatus of a superconducting transformer 20. The coolant line guide enclosure 14 is preferably an insulated metal casing. To the housing 10 of the enclosure is affixed an air conditioner 22 essentially similar to those used for climate control within habitable portable buildings and other enclosures exposed to outdoor environments. The housing 10 has access doors 24 to facilitate inspection and service. The housing 10 is in turn affixed to a side of the Dewar 26 housing the cryogenic components of the transformer.

The external structure of the coolant line guide enclosure 14 in the exemplary embodiment can be structured to conform generally to the path along which the coolant lines 16 are positioned. The coolant line guide enclosure 14, affixed to a mating opening in the housing 10, and encasing the coolant lines 16 over a portion of their path, provides stabilization and protection from external environmental events. A continuation of the shown coolant line guide enclosure 14 can be provided to encase the coolant lines 16 to the point where they contact the cryoheads 18, and can, in an alternate configuration, surround the cryoheads 18 in their entirety. For example, a ducted air path from the main housing 10 may be provided to ensure that the enclosed volume in the vicinity of the heads 18 is not permitted to overheat. Such a ducted air path may require additional cooling capacity.

Figure 2:
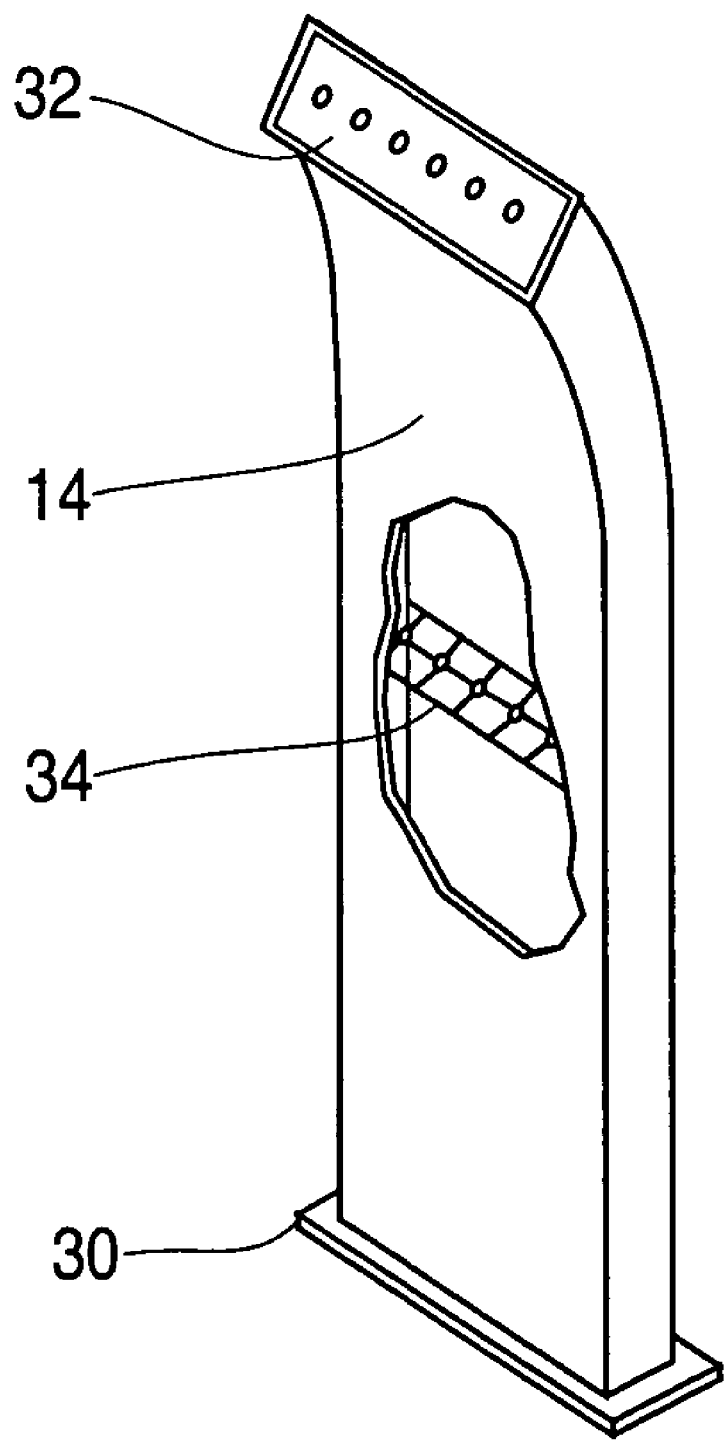
FIG. 2 is a perspective view of the coolant line guide enclosure.

FIG. 2 shows the coolant line guide enclosure 14 from another viewpoint. A base flange 30 provides structural stability and sealing to the main housing 10. A top face 32 seals the coolant line guide enclosure 14, allowing the thermal control that has been established within the main housing 10 to be extended to the extreme of the coolant line guide enclosure 14 if forced air feed is provided. The coolant line guide enclosure 14 can be insulated as an adjunct to any insulation fitted around the coolant lines 16. Inside the coolant line guide enclosure 14, tubing support brackets 34 can maintain separation and suppress vibration while accommodating position shifts in the coolant lines 16 as they expand and contract with temperature changes. The extreme cold of the gas flowing through both the inlet and outlet lines can introduce mechanical stress on the lines, since most materials tend to exhibit only limited strength at such temperatures.

Figure 3:
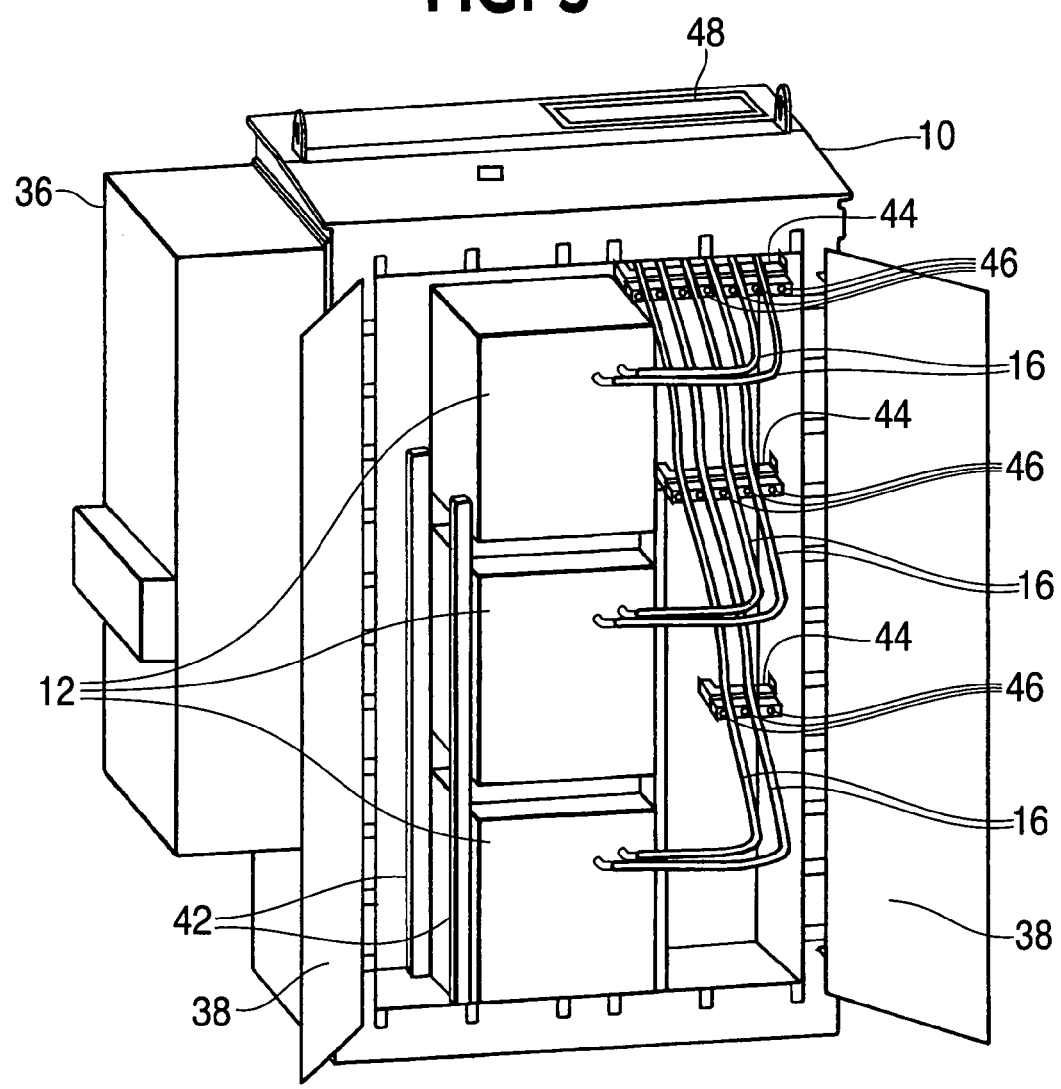
FIG. 3 is a perspective view of the cooling apparatus housing.

FIG. 3 shows another view of the housing 10. The air conditioner unit 36 can be configured to regulate the temperature at which the gaseous helium-based chilling units 12 operate. Much of the heat removed from the transformer 26 may be coupled to the helium system and expelled directly; heat leakage through the Dewar itself from outside may be captured by the nitrogen system, coupled to the helium system, and expelled similarly. However, the helium inside the cooling system may need to be maintained below 20 K at the boundaries of the transformer, and a substantial portion of the transformer heat not coupled to the nitrogen system directly may need to be removed by the gaseous helium compressors located outside the Dewar. This can be realized using standalone scroll compressors and associated heat transfer apparatus.

Since the scroll compressor-based chilling units 12 function with a preferred level of efficiency when able to draw in cooling air over a narrow and cool temperature range, generally about 10–20 degrees Celsius (about 50–70 degrees Fahrenheit), an air conditioner unit 36 suited to maintaining an air volume in this temperature range, both in a laboratory environment and when deployed outdoors in harsh environments, is desirable. The extensive range of commercially available sizes, form factors, and capabilities of air conditioners 36 can be advantageous in establishing reliable temperature regulation and thereby assuring stable operation of the superconducting transformer. The air conditioner unit 36 may in some cases preferably be a heat pump capable of raising the temperature inside the housing 10 if the superconducting transformer is placed where the rate of heat loss to the environment would be sufficient to chill the chilling units 12 below their optimum range despite their work in removing heat from the superconducting transformer, such as during a cold restart in winter. Required cooling capacity of the air conditioner unit 36 can be calculated based on insolation plus ambient air temperature over the range of naturally occurring environments, and sized by climate.

Air conditioning may also include adjustment of moisture levels in an enclosed volume. For this exemplary machinery application, there may be no effective lower limit on the desirable level of moisture, so the air conditioner may be configured to remove such moisture as may be introduced into the enclosure through leaks and through air interchange during servicing. In some environments, an excessively low moisture level may be disadvantageous, for example increasing the risk of electrostatic discharge damage to susceptible electronic devices; where such risks are significant, deliberate addition of moisture to the enclosed air volume may be desirable.

FIG. 3 further shows the insulated doors 38 that can limit heat penetration into the housing 10 while providing ready service access to the chilling units 12 and the coolant lines 16. A multiple-unit mounting rack 42 can provide stable support for the chilling units 12, and potentially can be equipped to attenuate at least to some extent motions that apply mechanical stress to the coolant lines 16. One or more piping support structures 44 can be positioned to provide mounting points for a plurality of coolant line guides 46. The flanged hole 48 accepts the flange of the coolant line guide enclosure, shown in FIG. 2.

It will be appreciated that an additional characteristic of a cryocooler management system as herein described is the capability to preserve system integration during transport. Thus, a system with appropriate structural integrity can withstand over-the-road travel as a single, sealed, unitary structure, thereby controlling installation and test time as well as risks of contamination and damage.

Although an example of the housing is shown using an electrically powered air conditioning unit 36, it will be appreciated that other types of air cooling units, such as compressed air vortex heat exchangers and chilled water heat exchangers, can provide the heat removal capability required for the superconducting transformer. Also, although the housing is useful to provide uniform rates of heat transfer in a prototype superconducting transformer environment, it can also be used for assured heat transfer in other applications, including for example thermally critical applications, such as research reactors, cyclotrons, and other cryogenic science applications.

Although the systems described thus far incorporate helium-to-air heat exchangers, which are well known in the art, it will be appreciated that the inefficiencies inherent in multiple heat exchange processes can be reduced by directly coupling heat from the helium system to a fluid capable of greater efficiency of transfer, whether in a closed system such as ammonia or fluorocarbon, or an open system such as evaporation or release of water.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described; accordingly, all suitable modifications and equivalents may be resorted to that fall within the scope of the invention.

What is claimed is:

1. An enclosure for containing at least one coolant compressor/chiller for a housed cryogenic apparatus, comprising:

a cabinet coupled to the apparatus housing, wherein said cabinet is configured for deployment in outdoor environments;

an air conditioner affixed to said cabinet, wherein said air conditioner is configured to establish an environmental regime within said cabinet compatible with operation of the coolant compressor/chiller over a range of outdoor environmental conditions;

a plurality of coolant line guides positioned within said cabinet; and a coolant line guide enclosure enclosing at least in part a coolant line pathway from the coolant compressor/ chillers to at least one element of cryogenic apparatus embedded in part in the cryogenic apparatus housing, wherein the surface of said coolant line guide enclosure proximal to the housed cryogenic apparatus conforms generally to the profile of the proximal surface of the cryogenic apparatus housing.

2. The enclosure of claim 1, wherein said coolant line guide enclosure entirely surrounds said coolant lines to an interface with the housed cryogenic apparatus.

3. An enclosure for containing at least one coolant compressor/chiller for a housed cryogenic apparatus, comprising:
- a cabinet coupled to the apparatus housing, wherein said cabinet is configured for deployment in outdoor environments;
- an air conditioner affixed to said cabinet, wherein said air conditioner is configured to establish an environmental regime within said cabinet compatible with operation of the coolant compressor/chiller over a range of outdoor environmental conditions;
- a plurality of coolant line guides positioned within said cabinet; and
- a coolant line guide enclosure enclosing at least in part a coolant line pathway from the coolant compressor/chillers to at least one element of cryogenic apparatus embedded in part in the cryogenic apparatus housing, wherein said coolant line guide enclosure is insulated.

4. The enclosure of claim 1, further comprising at least one piping support structure upon which said coolant line guides are mounted.

5. The enclosure of claim 1, wherein said coolant line guide enclosure further comprises at least one tubing support bracket.

6. The enclosure of claim 5, wherein said at least one tubing support bracket allows motion of said coolant lines while preventing said coolant lines from making contact with one another over the range of temperatures to which said enclosure is constrained by operation of said air conditioner.

7. The enclosure of claim 3, wherein said coolant line guide enclosure provides support to and separates said coolant lines with respect to the internal structure of said coolant line guide enclosure.

8. The enclosure of claim 3, further comprising an auxiliary ventilation system directing conditioned air to the region of said coolant line guide enclosure distal to said cabinet.

9. The enclosure of claim 3, further comprising at least one insulated door providing substantial closure of said cabinet when closed.

10. The enclosure of claim 3, further comprising a rack assembly supporting the coolant compressor/chillers in said cabinet.

11. The enclosure of claim 3, wherein said air conditioner removes heat from the air volume within said cabinet.

12. The enclosure of claim 3, wherein said air conditioner removes water vapor from the air volume within said cabinet.

13. The enclosure of claim 3, wherein said air conditioner adds heat to the air volume within said cabinet.

14. The enclosure of claim 3, wherein said air conditioner adds water vapor to the air volume within said cabinet.

15. An enclosure for containing at least one coolant compressor/chiller for a housed cryogenic apparatus, comprising:
- a cabinet coupled to the apparatus housing, wherein said cabinet is configured for deployment in outdoor environments;
- an air conditioner affixed to said cabinet, wherein said air conditioner is configured to establish an environmental regime within said cabinet compatible with operation of the coolant compressor/chiller over a range of outdoor environmental conditions;
- a plurality of coolant line guides positioned within said cabinet; and
- a coolant line guide enclosure enclosing at least in part a coolant line pathway from the coolant compressor/chillers to at least one element of cryogenic apparatus embedded in part in the cryogenic apparatus housing, wherein said coolant line guide enclosure is mated to said cabinet by a flanged clearance hole.

16. The enclosure of claim 15, wherein said flanged clearance hole permits entry by said coolant lines to said coolant line guide enclosure and is sealed to said cabinet.

17. An enclosure for containing at least one coolant compressor/chiller for a housed cryogenic apparatus, comprising:
- a cabinet coupled to the apparatus housing, wherein said cabinet is configured for deployment in outdoor environments;
- an air conditioner affixed to said cabinet, wherein said air conditioner is configured to establish an environmental regime within said cabinet compatible with operation of the coolant compressor/chiller over a range of outdoor environmental conditions;
- a plurality of coolant line guides positioned within said cabinet; and
- a coolant line guide enclosure enclosing at least in part a coolant line pathway from the coolant compressor/chillers to at least one element of cryogenic apparatus embedded in part in the cryogenic apparatus housing, wherein a coolant line exit from said coolant line guide enclosure at the end thereof distal to said cabinet comprises a multiplicity of individual close-fitted holes, each of which provides a stable, low-leakage passage for a single coolant line.

18. An enclosure for containing at least one coolant compressor/chiller for a housed cryogenic apparatus, comprising:
- a cabinet coupled to the apparatus housing, wherein said cabinet is configured for deployment in outdoor environments;
- an air conditioner affixed to said cabinet, wherein said air conditioner is configured to establish an environmental regime within said cabinet compatible with operation of the coolant compressor/chiller over a range of outdoor environmental conditions;
- a plurality of coolant line guides positioned within said cabinet; and
- a coolant line guide enclosure enclosing at least in part a coolant line pathway from the coolant compressor/chillers to at least one element of cryogenic apparatus embedded in part in the cryogenic apparatus housing, wherein said coolant line guide enclosure entirely surrounds said coolant lines and any element of said housed cryogenic apparatus not located within the housing of said housed cryogenic apparatus.

* * * * *